(12) United States Patent
Liu et al.

(10) Patent No.: US 10,796,730 B1
(45) Date of Patent: Oct. 6, 2020

(54) SEMICONDUCTOR MEMORY DEVICE AND WORD-LINE ACTIVATION METHOD

(71) Applicant: ELITE SEMICONDUCTOR MEMORY TECHNOLOGY INC., Hsinchu (TW)

(72) Inventors: Yi Heng Liu, Hsinchu (TW); Jian-Sing Liou, Hsinchu (TW)

(73) Assignee: Elite Semiconductor Memory Technology Inc., Hsinchu (TW)

(*) Notice: Subject to any disclaimer, the term of this patent is extended or adjusted under 35 U.S.C. 154(b) by 0 days.

(21) Appl. No.: 16/354,138

(22) Filed: Mar. 14, 2019

(51) Int. Cl.
    *G11C 5/10* (2006.01)
    *G11C 11/408* (2006.01)
    *G11C 11/4091* (2006.01)

(52) U.S. Cl.
    CPC .......... *G11C 5/10* (2013.01); *G11C 11/4085* (2013.01); *G11C 11/4087* (2013.01); *G11C 11/4091* (2013.01)

(58) Field of Classification Search
    CPC .......... G11C 11/4087; G11C 11/4085; G11C 11/4091
    See application file for complete search history.

(56) References Cited

U.S. PATENT DOCUMENTS

| | | | | |
|---|---|---|---|---|
| 7,064,376 B2* | 6/2006 | Shau | ...................... | G11C 7/18 |
| | | | | 257/296 |
| 2008/0112251 A1* | 5/2008 | Youn | ...................... | G11C 5/025 |
| | | | | 365/230.03 |
| 2014/0119091 A1* | 5/2014 | You | ...................... | G11C 11/406 |
| | | | | 365/72 |
| 2017/0372795 A1 | 12/2017 | He et al. | | |

OTHER PUBLICATIONS

Office Action to the corresponding Taiwan Patent Application rendered by the Taiwan Intellectual Property Office (TIPO) dated Oct. 4, 2019, 11 pages (including English translation of Office Action Summary).

* cited by examiner

*Primary Examiner* — Ajay Ojha
(74) *Attorney, Agent, or Firm* — Skaar Ulbrich Macari, P.A.

(57) ABSTRACT

A semiconductor memory device includes a memory bank of an open bit-line architecture and a word-line decoder. The memory bank is divided into a plurality of memory blocks in a bit-line direction, and each of the memory blocks includes a plurality of word lines, a plurality of bit lines and a plurality of memory cells which are grouped into a plurality of memory sections including two edge memory sections and at least one non-edge memory section. The word-line decoder generates a plurality of word-line enabling signals based on a plurality of address signals and activates one of the word lines for each of the two edge memory sections of one of the memory blocks and one of the word lines for one of the at least one non-edge memory section of each of the other memory blocks concurrently in an active mode according to the word-line enabling signals.

10 Claims, 6 Drawing Sheets

SEMICONDUCTOR MEMORY DEVICE AND WORD-LINE ACTIVATION METHOD

FIELD

The present disclosure relates to a semiconductor memory device and a word-line activation method. More specifically, the present disclosure relates to a semiconductor memory device including a memory bank of an open bit-line architecture and a word-line activation method for the memory bank.

BACKGROUND

Figure 1A:
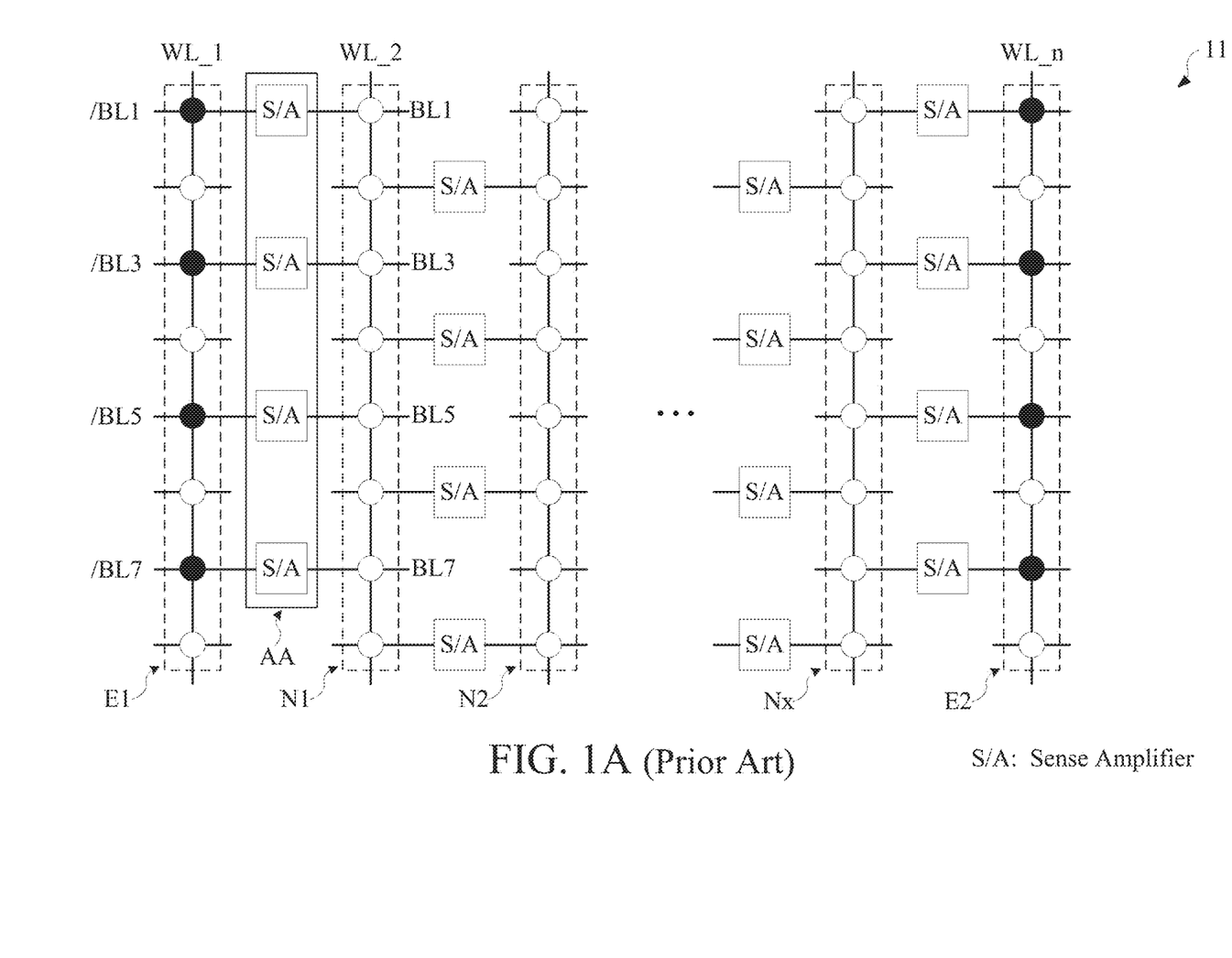
FIG. 1A illustrates a schematic view of a conventional memory bank of an open bit-line architecture.
Figure 1B:
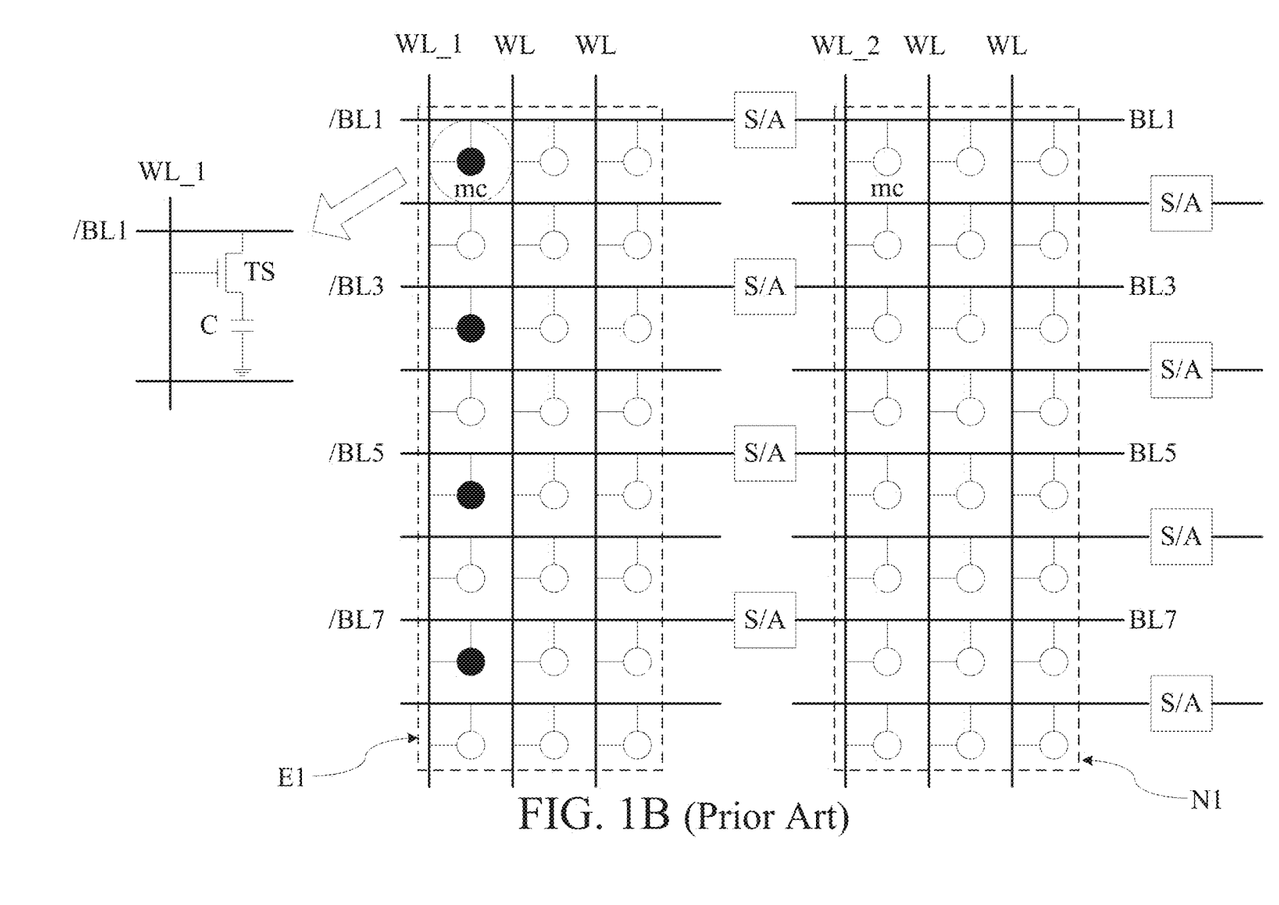
FIG. 1B illustrates a schematic view of a partial enlargement of the conventional memory bank shown in FIG. 1A.

FIG. 1A illustrates a schematic view of a conventional memory bank of an open bit-line architecture, and FIG. 1B illustrates a schematic view of a partial enlargement of the conventional memory bank shown in FIG. 1A. As shown in FIGS. 1A-1B, the conventional memory bank 11 comprises a plurality of memory cells me, a plurality of word lines WL, a plurality of pairs of bit lines BL and /BL and a plurality of sense amplifier arrays AA. The memory cells me are grouped into a plurality of memory sections including two edge memory sections E1 and E2 and one or more non-edge memory sections N1, N2, . . . , Nx. Each of the memory cells me includes a storage capacitor C and an access transistor TS coupled with the storage capacitor C, one bit line BL (or /BL) and one word line WL. Only one word line WL can be activated for each of the memory sections of the memory bank 11 at the same time to prevent that more than one memory cell me in the same row provide data to the same sense amplifier concurrently.

Under the open bit-line architecture, each of the pairs of bit lines BL and /BL is coupled to one sense amplifier and laid in opposite directions from each other on either side of the sense amplifier, and thus, each non-edge memory section is coupled with two sense amplifier arrays AA, but each of the edge memory sections E1 and E2 is coupled with one sense amplifier array AA only. Such architecture brings a problem that each of the edge memory sections E1 and E2 has only half of utilization rate of memory cells as compared with anyone of the non-edge memory sections N1, N2, . . . , Nx. To overcome this problem, two word lines are allowed to be activated for both of the edge memory sections at the same time with double current consumption for activing the two word lines. For example, as eight-bit data is going to be written into the conventional memory bank 11, one way is to activate one word line (e.g., the word line WL_2) for one of the non-edge memory sections N1, N2, . . . , Nx, while another way is to activate two word lines (e.g., the word lines WL_1 and WL_n) for both of the edge memory sections E1 and E2 with double current consumption for activating the two word lines. In view of this, it is important to provide a solution to improve the problem.

SUMMARY

The present disclosure provides a semiconductor memory device. The semiconductor device can comprise a memory bank of an open bit-line architecture and a word-line decoder coupled with the memory bank. The memory bank can be divided into a plurality of memory blocks in a bit-line direction, wherein each of the memory blocks comprises a plurality of word lines, a plurality of bit lines and a plurality of memory cells which are grouped into a plurality of memory sections including two edge memory sections and at least one non-edge memory section. The word-line decoder may be configured to generate a plurality of word-line enabling signals based on a plurality of address signals. The word-line decoder may further be configured to activate one of the word lines for each of the two edge memory sections of one of the memory blocks and one of the word lines for one of the at least one non-edge memory section of each of the other memory blocks concurrently in an active mode according to the word-line enabling signals.

The present disclosure also provides a word-line activation method for a memory bank of an open bit-line architecture. The memory bank can comprise a plurality of memory blocks, and each of memory blocks may comprise a plurality of word lines, a plurality of bit lines and a plurality of memory cells which are grouped into a plurality of memory sections including two edge memory sections and at least one non-edge memory section. The word-line activation method may comprise: generating, by a word-line decoder, a plurality of word-line enabling signals based on a plurality of address signals; and activating, by the word-line decoder, one of the word lines for each of the two edge memory sections of one of the memory blocks and one of the word lines for one of the at least one non-edge memory section of each of the other memory blocks concurrently in an active mode according to the word-line enabling signals.

Instead of a whole memory bank, each memory block which is organized by specifically dividing the whole memory bank in a bit-line direction is a separate portion whose word lines can be activated or deactivated without affecting those of the other memory blocks. Under such a design, word lines can be activated for both of two edge memory sections and at least one non-edge memory section at the same time as the two edge memory sections and the at least one non-edge memory section belong to different memory blocks. In doing so, the two edge memory sections with half utilization rate of a memory block can be improved by one or more non-edge memory sections with full utilization rate of other memory blocks, and thus, current consumption for activing word lines can be improved as compared with the conventional memory bank 11.

The aforesaid content is not intended to limit the present invention, but merely provides preliminary profile of the present invention to people having ordinary skill in the art. People having ordinary skill in the art can understand the details of the present invention according to the attached drawings and the embodiments recited in the following detailed description.

DETAILED DESCRIPTION

The example embodiments described herein are not intended to limit the invention to any specific environment, applications, structures, processes, embodiments, examples or steps described in these example embodiments. In the attached drawings, elements unrelated to the present invention are omitted from depiction. Dimensions and dimensional relationships among individual elements in the attached drawings are only exemplary examples and are not intended to limit the present invention. Unless stated particularly, same (or similar) element numerals may correspond to same (or similar) elements in the following description.

The terminology used herein is for the purpose of describing the embodiments only and is not intended to limit the present invention. The singular forms "a" and "an" are intended to include the plural forms as well, unless the context clearly indicates otherwise. The terms "comprises," "comprising," "includes," "including," etc., specify the presence of the stated features, integers, steps, operations, elements, and/or components, but do not preclude the presence or addition of one or more other features, integers, steps, operations, elements, components, and/or groups thereof. The term "and/or" includes any and all combinations of one or more of the associated listed items. Although the terms "first," "second," "third," etc., may be used herein to describe various elements, these elements should not be limited by these terms. These terms are merely used to distinguish one element from another element. Thus, for example, a first element described below could also be termed a second element, without departing from the spirit and scope of the present invention.

Figure 2:
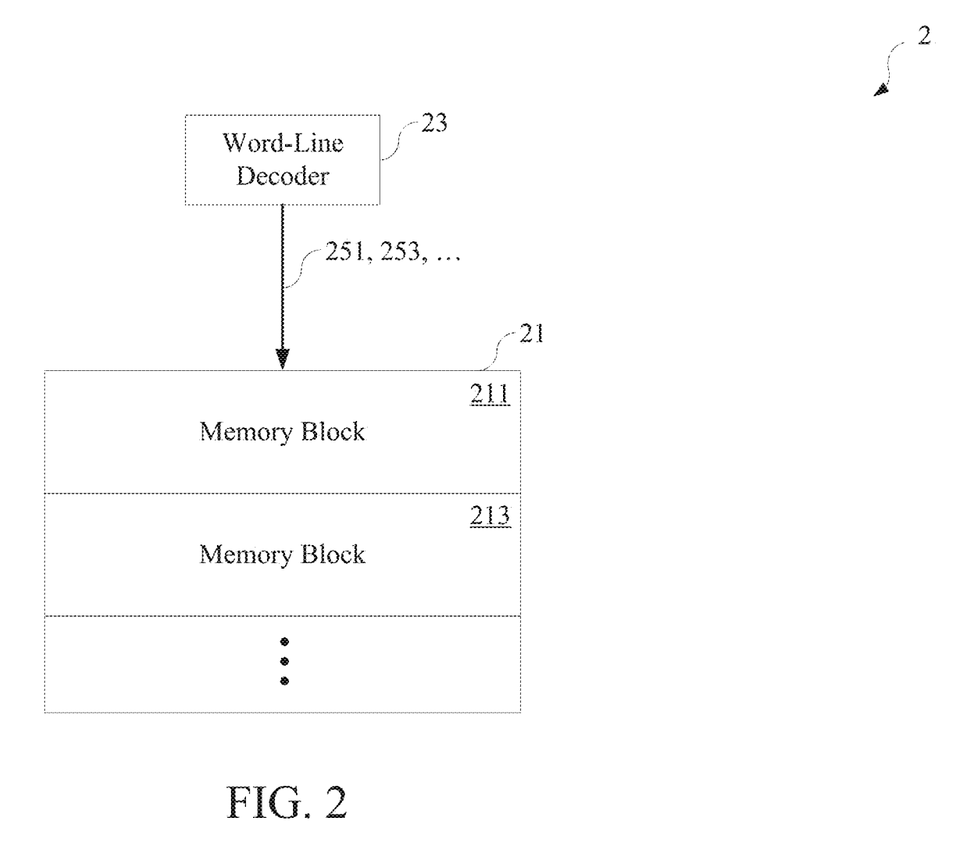
FIG. 2 illustrates a schematic view of a semiconductor memory device according to one or more embodiments of the present invention.
Figure 3A:
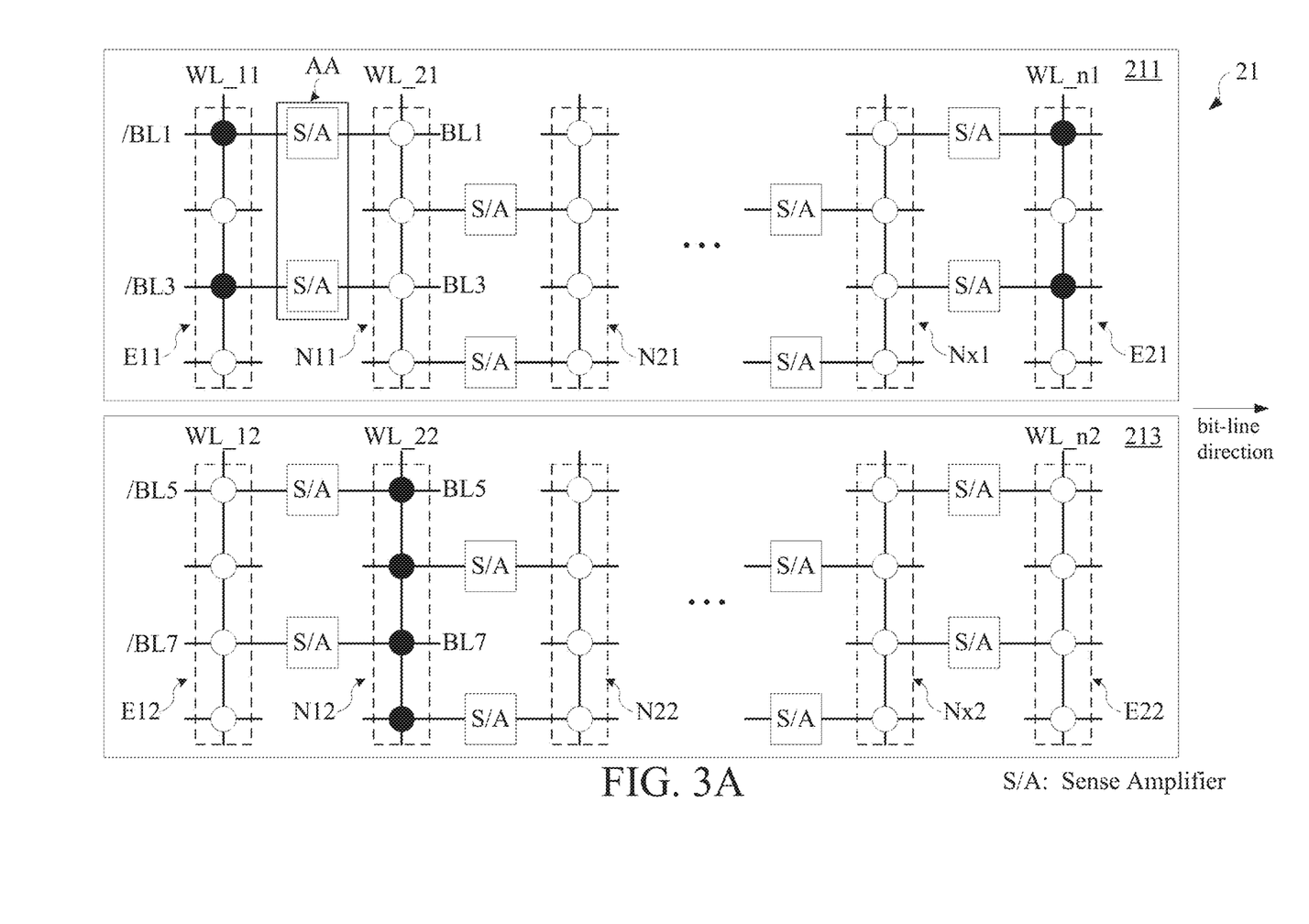
FIG. 3A illustrates a schematic view of a memory bank shown in FIG. 2 according to one or more embodiments of the present invention.
Figure 3B:
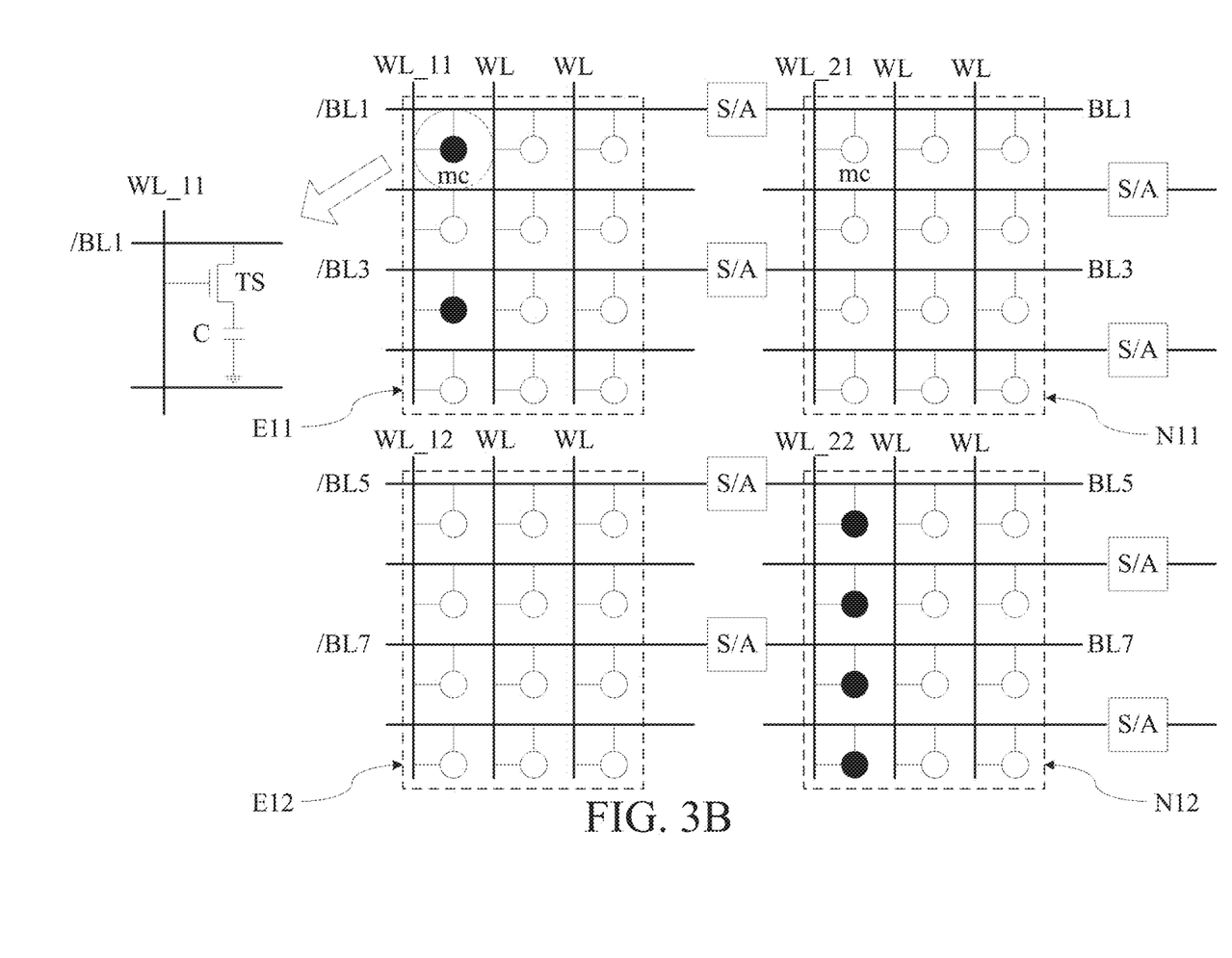
FIG. 3B illustrates a schematic view of a partial enlargement of the memory bank shown in FIG. 3A.

FIG. 2 illustrates a schematic view of a semiconductor memory device according to one or more embodiments of the present invention. FIG. 3A illustrates a schematic view of a memory bank shown in FIG. 2 according to one or more embodiments of the present invention, while FIG. 3B illustrates a schematic view of a partial enlargement of the memory bank shown in FIG. 3A. The contents shown in FIG. 2, FIG. 3A and FIG. 3B are merely for explaining the embodiments of the present invention instead of limiting the present invention.

Referring to FIG. 2, FIG. 3A and FIG. 3B together, a semiconductor memory device 2 may comprise a memory bank 21 of an open bit-line architecture and a word-line decoder 23 coupled with the memory bank 21. The memory bank 21 is as similar as the conventional memory bank 11, but the memory bank 21 is divided into a plurality of memory blocks (e.g., the memory blocks 211 and 213) in a bit-line direction. The word-line decoder 23 may be configured to receive a plurality of address signals from an address buffer (not shown) coupled with the word-line decoder 23 and generate the word-line enabling signals based on the address signals. In addition, the word-line decoder 23 may be configured to generate a plurality of word-line enabling signals (e.g., the word-line enabling signals 251 and 253), and transmit the word-line enabling signals to the memory bank 21. Each of the word-line enabling signals can activate one or more word lines coupled with the corresponding memory block. For example, the word-line enabling signal 251 can activate one or more word lines coupled with the memory block 211 while the word-line enabling signal 253 can activate one or more word lines coupled with the memory block 213.

In some embodiments, the semiconductor memory device 2 may comprise a plurality of word-line decoders 23, which are configured to generate the word-line enabling signals for activating the word lines coupled with the memory blocks respectively.

Each of the memory blocks (e.g., the memory blocks 211 and 213) may comprise a plurality of word lines (e.g., the word lines WL_11, WL_21, . . . , WL_n1 coupled with the memory block 211, and the word lines WL_12, WL_22, . . . , WL_n2 coupled with the memory block 213), a plurality of bit lines (e.g., the bit lines BL1, /BL1, BL3 and /BL3 coupled with the memory block 211, and the bit lines BL5, /BL5, BL7 and /BL7 coupled with the memory block 213) and a plurality of memory cells me which are grouped into a plurality of memory sections including two edge memory sections (e.g., the edge memory sections E11 and E21 of the memory block 211, and the edge memory sections E12 and E22 of the memory block 213) and at least one non-edge memory section (e.g., the non-edge memory sections N11, N21, . . . , Nx1 of the memory bank 211, and the non-edge memory sections N12, N22, . . . , Nx2 of the memory block 213). Each of the memory cells me may comprise a storage capacitor C and an access transistor TS which is coupled with the storage capacitor C, one bit line and one word line (e.g., the access transistor TS is coupled with the bit line/BL1 and the word line WL_11 in the cell of the edge memory sections E11). The word lines coupled with each of the memory blocks are separate from those coupled with the others. In addition, the memory blocks comprises the same number of memory cells me, which indicates that the memory bank 21 is equally divided. In some embodiments, however, the memory blocks may comprise different numbers of memory cells me, which indicates that the memory bank 21 may also be unequally divided.

Each of the memory blocks also comprises a plurality of sense amplifier arrays AA, and depending on the number of memory cells me, each of the sense amplifier arrays AA may comprise two or more sense amplifier. In addition, in each of the memory blocks, each of the edge memory sections is only coupled with one single sense amplifier array AA and each of the at least one non-edge memory sections is coupled with two sense amplifier arrays AA. For example, in the memory block 211, each of the edge memory sections E11 and E21 is coupled with only one single sense amplifier array AA, and each of the non-edge memory sections N11, N21, . . . , Nx1 is coupled with two sense amplifier arrays AA. Similarly, in the memory block 213, each of the edge memory sections E12 and E22 is coupled with only one single sense amplifier array AA, and each of the non-edge memory sections N12, N22, . . . , Nx2 is coupled with two sense amplifier arrays AA.

Under the structure of the memory bank 21, the word-line decoder 23 may activate one word line for each of the two edge memory sections of one of the memory blocks and activate one word line for one of the at least one non-edge memory section of each of the other memory blocks concurrently in an active mode according to the word-line enabling signals. For example, as shown in FIG. 3, as a piece of eight-bit data is going to be written into the memory bank 21, the word-line decoder 23 may activate the word lines WL_11 and WL_n1 which are coupled with the edge memory sections E11 and E21 respectively in the memory block 211 according to the word-line enabling signals 251 and also activate the word line WL_22 connected with the non-edge memory section N12 in the memory block 213 according to the word-line enabling signals 253, in an active mode at the same time. Only two memory cells me can be accessed as each of the word lines WL_11 and WL_n1 is activated while four memory cells me can be accessed as the word line WL_22 is activated, and thus, the utilization rate (i.e. the number of the accessed memory cells divided by that of the memory cells coupled with the word lines WL_11, WL_n1 and WL_22) is 8/12. As compared with the conventional memory bank 11 which activates with the word lines WL_11, WL_n1 for writing the same piece of eight-bit data, with a poor utilization rate of 8/16, the current consumption can be decreased by 25% because only 75% word line current (i.e., 12/16) is required. In addition, the utilization rate of memory cells is improved by 1/6°

In some embodiments where the memory bank 21 is divided into more than two memory blocks, the semiconductor memory device 2 can still get less current consumption and better utilization rate of memory cells as compared with the conventional memory bank 11 because of the proposed way of activating word lines. The details of activating the word lines in these embodiments can be directly and easily understood by the people having ordinary skills in the art based on the above descriptions, and thus will not be further described herein.

In some embodiments, the memory bank 21 may be divided into a plurality of memory blocks which comprise different number of memory cells me with each other, which indicates that the memory bank 21 is divided in an uneven manner. Under the circumstances, the semiconductor memory device 2 can still get less current consumption and better utilization rate of memory cells as compared with the conventional memory bank 11 because of the proposed way of activating word lines. The details of activating the word lines in these embodiments can be directly and easily understood by the people having ordinary skills in the art based on the above descriptions, and thus will not be further described herein.

Figure 4:
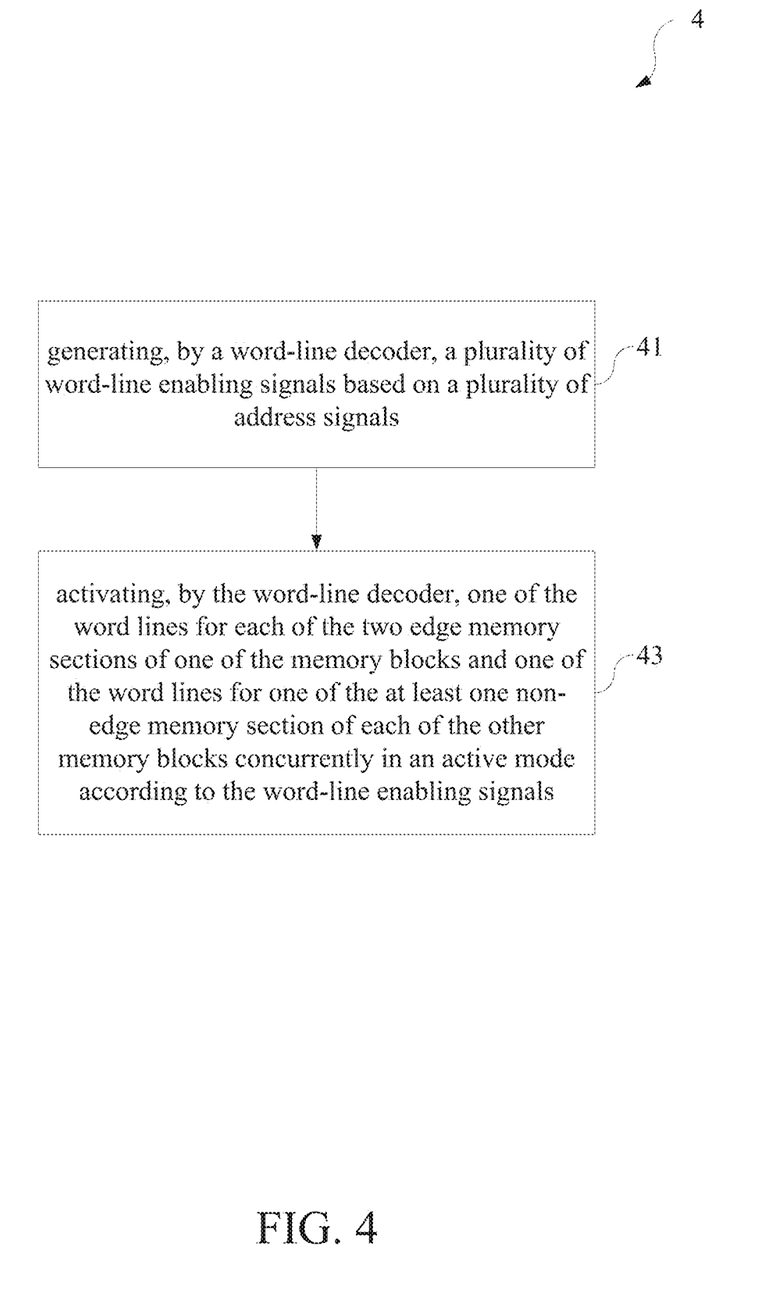
FIG. 4 illustrates a schematic view of a word-line activation method for a memory bank of an open bit-line architecture according to one or more embodiments of the present invention.

FIG. 4 illustrates a schematic view of a word-line activation method for a memory bank of an open bit-line architecture according to one or more embodiments of the present invention. The contents shown in FIG. 4 are merely for explaining the embodiments of the present invention instead of limiting the present invention.

Referring to FIG. 4, a word-line activation method 4 for a memory bank of an open bit-line architecture is shown. The memory bank may comprise a plurality of memory blocks each of which comprises a plurality of word lines, a plurality of bit lines and a plurality of memory cells which are grouped into a plurality of memory sections including two edge memory sections and at least one non-edge memory section. The word-line activation method 4 may comprise the following steps:

generating, by a word-line decoder, a plurality of word-line enabling signals based on a plurality of address signals (marked with a step 41); and activating, by the word-line decoder, one of the word lines for each of the two edge memory sections of one of the memory blocks and one of the word lines for one of the at least one non-edge memory section of each of the other memory blocks concurrently in an active mode according to the word-line enabling signals (marked with a step 43).

In some embodiments, each of the memory blocks may comprise a plurality of sense amplifier arrays. Moreover, in each of the memory blocks, each of the edge memory sections of may be coupled with only one of the sense amplifier arrays and each of the at least one non-edge memory sections may be coupled with two of the sense amplifier arrays.

In some embodiments, the memory blocks may have the same number of memory cells. In some embodiments, the word lines of each of the memory blocks may be separate from those of the other memory blocks. In some embodiments, each of the memory cells may comprise a storage capacitor and an access transistor coupled with the storage capacitor, one of the bit lines and one of the word lines.

In addition to the aforesaid steps, in some embodiments, the word-line activation method 4 may further comprise other steps corresponding to the operations of the semiconductor memory device 2 as mentioned above. Since the steps which are not mentioned specifically can be easily and directly understood by people having ordinary skill in the art based on the aforesaid descriptions for the semiconductor memory device 2, they will not be further described herein.

The above disclosure is related to the detailed technical contents and inventive features thereof. People having ordinary skill in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A semiconductor memory device, comprising:
a memory bank of an open bit-line architecture, being divided into a plurality of memory blocks in a bit-line direction, wherein each of the memory blocks comprises a plurality of word lines, a plurality of bit lines and a plurality of memory cells which are grouped into a plurality of memory sections including two edge memory sections and at least one non-edge memory section; and
a word-line decoder coupled with the memory bank and configured to:
generate a plurality of word-line enabling signals based on a plurality of address signals; and
activate one of the word lines for each of the two edge memory sections of one of the memory blocks and one of the word lines for one of the at least one non-edge memory section of each of the other memory blocks concurrently in an active mode according to the word-line enabling signals.

2. The semiconductor memory device of claim 1, wherein each of the memory blocks comprises a plurality of sense amplifier arrays, and in each of the memory blocks, each of the edge memory sections is coupled with only one of the sense amplifier arrays and each of the at least one non-edge memory sections is coupled with two of the sense amplifier arrays.

3. The semiconductor memory device of claim 1, wherein the memory blocks have the same number of memory cells.

4. The semiconductor memory device of claim 1, wherein the word lines of each of the memory blocks are separate from those of the other memory blocks.

5. The semiconductor memory device of claim 1, wherein each of the memory cells comprises:
a storage capacitor; and
an access transistor, coupled with the storage capacitor, one of the bit lines and one of the word lines.

6. A word-line activation method for a memory bank of an open bit-line architecture, the memory bank comprising a plurality of memory blocks, each of memory blocks comprising a plurality of word lines, a plurality of bit lines and a plurality of memory cells which are grouped into a plurality of memory sections including two edge memory sections and at least one non-edge memory section, the word-line activation method comprising:
generating, by a word-line decoder, a plurality of word-line enabling signals based on a plurality of address signals; and activating, by the word-line decoder, one of the word lines for each of the two edge memory sections of one of the memory blocks and one of the word lines for one of the at least one non-edge memory section of each of the other memory blocks concurrently in an active mode according to the word-line enabling signals.

7. The word-line activation method of claim 6, wherein each of the memory blocks comprises a plurality of sense amplifier arrays, and in each of the memory blocks, each of the edge memory sections is coupled with only one of the sense amplifier arrays and each of the at least one non-edge memory sections is coupled with two of the sense amplifier arrays.

8. The word-line activation method of claim 6, wherein the memory blocks have the same number of memory cells.

9. The word-line activation method of claim 6, wherein the word lines of each of the memory blocks are separate from those of the other memory blocks.

10. The word-line activation method of claim 6, wherein each of the memory cells comprises a storage capacitor and an access transistor coupled with the storage capacitor, one of the bit lines and one of the word lines.

\* \* \* \* \*